United States Patent [19]
Sakamoto et al.

[11] Patent Number: 4,999,669
[45] Date of Patent: Mar. 12, 1991

[54] LEVELLING DEVICE IN AN EXPOSURE APPARATUS

[75] Inventors: Hideaki Sakamoto; Kesayoshi Amano, both of Tokyo, Japan

[73] Assignee: Nikon Corporation, Tokyo, Japan

[21] Appl. No.: 378,981

[22] Filed: Jul. 12, 1989

[30] Foreign Application Priority Data

Jul. 18, 1988 [JP] Japan .................. 63-178560

[51] Int. Cl.$^5$ ........................................... G03B 27/42
[52] U.S. Cl. ........................ 355/53; 356/400
[58] Field of Search ............ 355/53, 55; 356/358, 356/375, 400, 401

[56] References Cited

U.S. PATENT DOCUMENTS

| | | | |
|---|---|---|---|
| 4,558,949 | 12/1985 | Uehara et al. | 356/400 X |
| 4,650,983 | 3/1987 | Suwa | 250/204 |
| 4,770,531 | 9/1988 | Tanaka et al. | 356/401 X |

*Primary Examiner*—L. T. Hix
*Assistant Examiner*—D. Rutledge
*Attorney, Agent, or Firm*—Shapiro and Shapiro

[57] ABSTRACT

An exposure apparatus for forming a pattern of a mask on a photo-sensitive substrate comprises an X-Y stage, a Z-stage supported on the X-Y stage, and a levelling stage that supports the photo-sensitive substrate. The levelling stage is supported on the Z-stage by a plurality of levelling devices that define a levelling reference plane, and that are operated in unison to change the level of the levelling stage relative to the Z-stage and relative to an exposure reference plane that is parallel to the levelling reference plane. The levelling devices are also operated individually to change the inclination of the photo-sensitive substrate relative to the levelling reference plane and relative to the exposure reference plane. A focus detector controls the movement of the Z-stage and the in-unison movement of the levelling devices. An inclination detector controls the individual operation of the levelling devices. The net result is that the surface of the photo-sensitive substrate is made coincident with the exposure reference plane and the levelling reference plane, and the center point of the surface of the photo-sensitive substrate becomes the pivotal center for changes in inclination of the photo-sensitive substrate.

11 Claims, 6 Drawing Sheets

LEVELLING DEVICE IN AN EXPOSURE APPARATUS

BACKGROUND OF THE INVENTION

1. Field of the Invention

This invention relates to an exposure apparatus for the manufacture of semiconductive integrated circuits, and in particular to an exposure apparatus provided with a levelling mechanism for bringing the surface of a wafer into exact coincidence with an exposure reference plane.

2. Related Background Art

In the lithography process in the manufacture of semiconductive integrated circuits, a reduction projection type exposure apparatus of the step and repeat type, i.e., a so-called stepper, bears the main role in the lithography process. In such stepper, it is necessary to enhance the resolution limit of a projection lens correspondingly to the minimum line width of circuits formed, in the order of a submicron. The minimum line width becomes more minute year after year. At the same time a very severe requirement for satisfying both a great numerical aperture (N.A.) and a wide exposure field is increasing. However, a projection lens of a great numerical aperture (N.A.) and of a wide exposure field necessarily has a small depth of focus and therefore, if in a portion of any shot area on a wafer, inclination should occur relative to the projection image plane, it will become difficult to always effect accurate focusing on the whole surface in the exposure field. So, by the use of a horizontal position detecting optical system as disclosed, for example, U.S. Pat. No. 4,558,949, the inclination relative to the projection image plane is detected in each shot area on the wafer, and likewise, by the use of a stage device (wafer stage) as disclosed in U.S. Pat. No. 4,770,531, a plurality of predetermined points (e.g. three operating points) on a levelling stage are driven, whereby the angle of inclination of the levelling stage is controlled so that the inclination of each shot area becomes zero. When the levelling stage is to be inclined in any direction relative to the projection image plane, use is made chiefly of a two-point driving system in which one operating point is fixed and the remaining two operating points are driven.

In the above-described wafer stage, the design is such that when the stage is in a predetermined neutral state (a state in which, for example, the operating points are at the center of the movement stroke in Z-direction), the plurality of points on the levelling stage are positioned in an exposure reference plane containing the measuring axis of a laser interferometer of the wafer stage (the center axis of a laser beam) and the exposure reference plane coincides with the surface of a reference wafer placed on the levelling stage and also coincides with the projection image plane (the imaging plane) of a mask pattern formed by a projection lens.

As a result, by the use of a levelling mechanism comprising the above-mentioned horizontal position detecting optical system and the wafer stage, the surface of the shot area is brought into exact coincidence with the exposure reference plane or the imaging plane, whereby the projected image of the circuit pattern of a mask or reticle (hereinafter simply referred to as the "reticle") is projected and exposed with a high resolution without causing any partial focus deviation in the exposure field.

However, when replacement of a wafer or a wafer holder is effected in the stepper having the levelling mechanism of this type, the thicknesses of the wafer and the wafer holder, i.e., the thickness of the portion above the levelling stage, may be varied by an increase in the total thickness variation (hereinafter referred to as "TTV") of the wafer itself resulting from the tolerance of manufacture, manufacturing error, etc. Therefore, a deviation in Z-direction (focus deviation) occurs between the imaging plane and the surface of the wafer and also, a deviation in Z-direction occurs between a surface which provides the reference of the inclining movement of the levelling stage (hereinafter referred to as the "levelling reference surface") and the surface of the wafer.

Of these two deviations in Z-direction, the focus deviation can be eliminated by moving a Z-stage, but the deviation between the levelling reference surface and the surface of the wafer remains. In a state in which this deviation remains, the levelling of any shot area on the wafer is effected with the levelling stage inclined, for example, by an angle $\frac{1}{4}$, and there has been a problem of lateral deviation of the center of the shot area relative to the coordinates system XY, in which the distance $\delta$ between the center of this shot area and the apparent center of pivotal movement of the levelling stage is a factor, i.e., so-called cosine error $\Delta Ce$ ($\Delta Ce = \delta \cdot (1 - \cos\theta)$, and a problem of lateral deviation in which the amount of deviation $\nu$ in height between the center of the shot area and the center of pivotal movement of the levelling stage is as a factor, i.e., so-called sine error $\Delta Se$ ($\Delta Se = \nu/2 \cdot \sin\theta$).

Usually, the angle of inclination $\theta$ of the wafer is 1' at greatest and the distance $\delta$ is of the order of 220 mm (in the case of 8 inches) at greatest and thus, cosine error $\Delta Ce$ is of the order of 0.01 $\mu$m at greatest. Also, the tolerance of the thickness variation of the wafer and wafer holder is $\pm 75\mu$m and TTV is of the order of 20 $\mu$m and therefore, sine error $\Delta Se$ is of the order of 0.028 $\mu$m at greatest. The amount of lateral deviation comprising the sum of these errors is nevertheless too great for the positioning accuracy (of the order of 0.03 $\mu$m) required for the wafer stage of the stepper of this type. To correct these errors, the alignment between the projected image of the pattern and the pattern already formed on the wafer must be effected again after levelling is effected in each shot area, and this has led to the problem that the throughput is reduced.

SUMMARY OF THE INVENTION

Accordingly, it is an object of the present invention to solve the above-noted problems peculiar to the apparatus of the prior art and to provide an exposure apparatus having a highly accurate levelling mechanism which, even if a deviation occurs between the levelling reference surface and the surface of a wafer, can suppress the amount of lateral deviation comprising the sum of the cosine error and the sine error to less than a predetermined tolerance value, or zero and can accomplish exposure without reducing the positioning accuracy, the throughput, etc. of a wafer stage.

To achieve the above object, the apparatus of the present invention, which has a horizontal position detecting system for detecting the inclination of a wafer relative to the imaging plane of a projection lens, and in which the surface of the wafer is brought into coincidence with the imaging plane in conformity with the detection signal of said horizontal position detecting system, whereby a circuit pattern formed on a reticle is projected and exposed onto the wafer through the projection lens, is characterized by the provision of an X-Y stage holding the wafer thereon and two-dimensionally movable in the imaging plane, a Z-stage provided on the X-Y stage and movable in a direction perpendicular to the imaging plane (Z-direction), a levelling stage provided on the Z-stage and capable of inclining the wafer in any direction relative to the imaging plane, position setting means for moving each of a plurality of points which provides a pivot fulcrum of the levelling stage in Z-direction to thereby accomplish the position setting of the surface of the wafer relative to the levelling reference surface of the levelling stage, deviation detecting means for detecting any positional deviation in Z-direction between the levelling reference surface and the surface of the wafer, and control means for controlling said position setting means on the basis of the detection signal of said deviation detecting means so that the levelling reference surface becomes substantially coincident with the surface of the wafer.

Further, according to a specific embodiment of the present invention, a driving device as the position setting means has three potentiometers for detecting the amounts of displacement of three pivots in Z-direction, and these three pivots are servo-controlled on the basis of the detection signals of these potentiometers and the detection signal of a focus detecting system as the deviation detecting means so as to make the levelling reference surface substantially coincident with the surface of the wafer.

As described above, according to the present invention, if any deviation occurs between the levelling reference surface and the surface of the wafer, the position setting means of the levelling stage, i.e., the three pivots, are driven by the same amount in Z-direction on the basis of the detection signal of the deviation detecting means, whereby the levelling reference surface is brought substantially into coincidence with the surface of the wafer, whereafter levelling is effected. Accordingly, the amount of lateral deviation comprising the sum of cosine error and sine error resulting from levelling can be suppressed to less than a predetermined tolerance value, i.e., less than the resolving power (0.02 $\mu$m) of a laser interferometer, or zero.

According to the present invention, the design is such that even if the thicknesses of a wafer and a wafer holder vary and any deviation occurs between the levelling reference surface and the surface of the wafer, such deviation is corrected and thereafter levelling is effected and therefore, the amount of lateral deviation comprising the sum of cosine error and sine error can be reduced to a practically negligibly small value (less than the resolving power of the laser interferometer), or zero, and it is not necessary to effect fine alignment again after levelling by the use of an alignment optical system (a so-called laser step alignment optical system) for observing only the wafer through a projection lens from between a reticle and the projection lens, for example, as an off-axis system. Also, since levelling is effected by a three-point driving system, the amount of resilient deformation of a leaf spring can be made small, and this is advantageous in controlling the inclination of the levelling stage, as viewed from the absolute value of the resilient deformation of the leaf spring and also the absolute amount of vertical movement of three pivots can be made small, and it becomes possible to shorten the control time of levelling. As a result, there can be realized an exposure apparatus having a highly accurate levelling mechanism which can accomplish exposure without reducing the throughput.

Further objects, features and effects of the present invention will become fully apparent from the following detailed description taken in conjunction with the accompanying drawings.

DESCRIPTION OF THE PREFERRED EMBODIMENT

Figure 1:
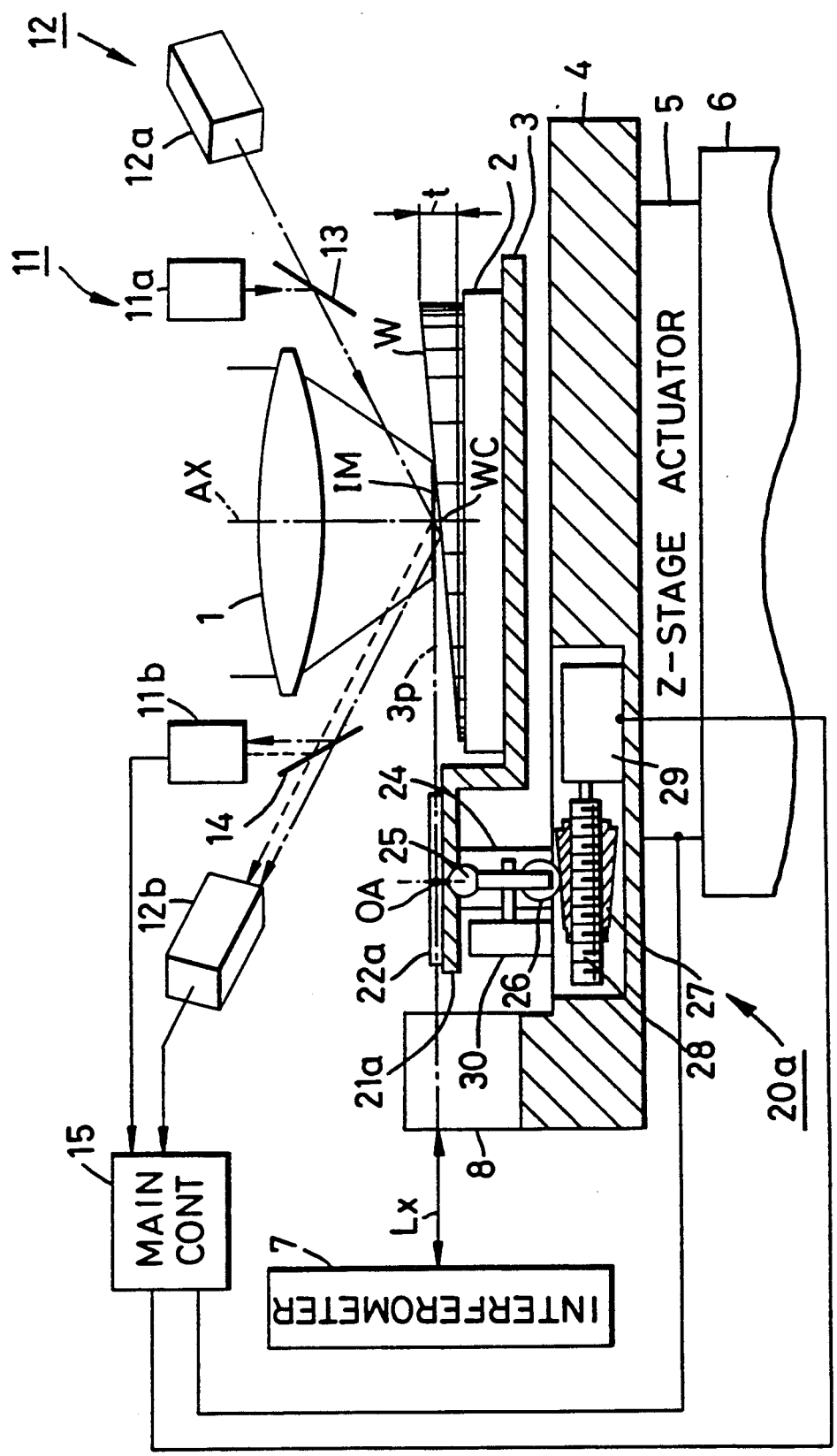
FIG. 1 is a diagram, partly in cross-section, schematically showing the construction of an embodiment of the present invention.

An embodiment of the present invention will hereinafter be described in detail with reference to the accompanying drawings. FIG. 1 is a diagram, partly in cross-section, schematically showing the construction of a stepper provided with a levelling mechanism according to an embodiment of the present invention, and FIG. 2 is a plan view schematically showing the construction of a wafer stage.

In FIG. 1, a one-side telecentric or both-side telecentric projection lens 1 having an optic axis AX perpendicular to the XY movement plane (the coordinates system XY) of a wafer W forms the projected image of a circuit pattern depicted on a reticle on a predetermined exposure reference plane, i.e., the imaging plane IM. The wafer W to be exposed is held on a levelling stage 3 inclinable in any direction relative to the imaging plane IM, with a wafer holder 2 interposed therebetween. The levelling stage 3 is provided on a Z-stage 4 which in turn is provided on an X-Y stage 6 movable in X- and Y-directions along the imaging plane IM.

Figure 2:
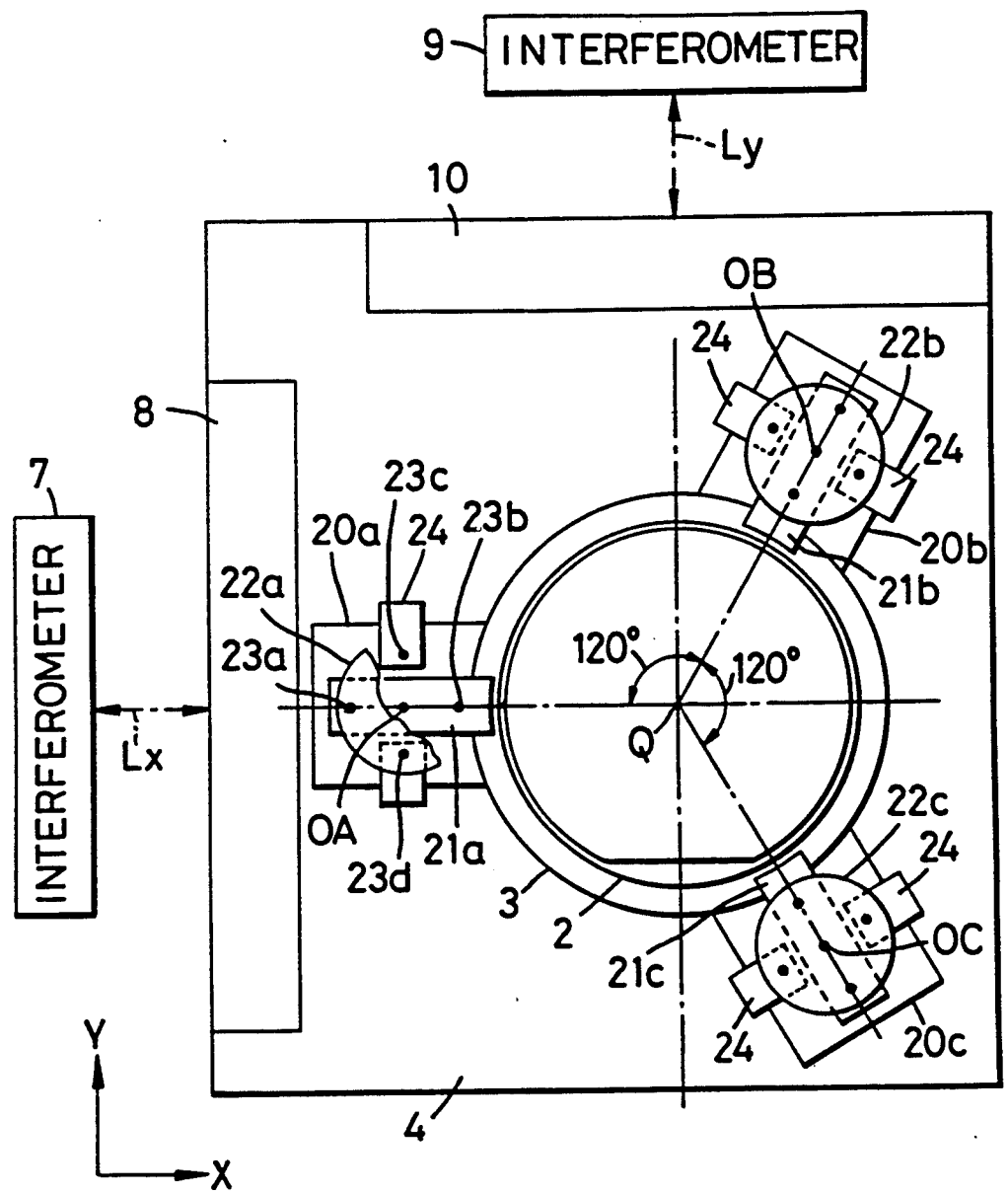
FIG. 2 is a plan view schematically showing the construction of the wafer stage portion in FIG. 1.

Also, the Z-stage 4 is designed to be moved only in Z-direction (the direction of the optic axis AX) relative to the X-Y stage 6 by an actuating portion 5, and a plane mirror 8 for a laser interferometer 7 for detecting the position in X-direction and a plane mirror 10 for a laser interferometer 9 for detecting the position in Y-direction as shown in FIG. 2 are provided on the end portion of the Z-stage 4. The center lines of laser beams applied from the laser interferometers 7 and 9 are measuring axes Lx and Ly in X- and Y-directions, respectively, and the measuring axes Lx and Ly are orthogonal to each other at a point Q and are defined so that the optic axis AX of the projection lens 1 passes through this point Q. Both of FIGS. 1 and 2 show a state in which the center point (reference point) of the wafer W (hereinafter referred to as the "wafer center WC") is registered to the point Q, and it is to be understood that the wafer W has thickness irregularity of t due to TTV.

Now, as shown in FIG. 2, on the levelling stage 3, radially extending arm portions 21a, 21b and 21c are provided integrally with one another at an angular interval of about 120 degrees with respect to the center of placement of the wafer on the levelling stage 3. Disc-shaped leaf springs 22a, 22b and 22c which are resiliently deformable in Z-direction but are not deformable at all with respect to X- and Y-directions are provided on the upper surfaces of the arm portions 21a, 21b and 21c, respectively, and the leaf spring 22a (as well as the leaf springs 22b and 22c) is fixed (screw-set) to the arm portion 21a at two locations 23a and 23b spaced apart from each other by 180 degrees. Also, two locations 23c and 23d spaced apart from the fixed points 23a and 23b of the leaf spring 22a and spaced apart from each other by about 90 degrees are fixed (screw-set) to a fixing member 24 provided integrally with the Z-stage 4 with the arm portion 21a interposed therebetween. The other leaf springs 22b and 22c are of similar construction. Accordingly, the levelling stage 3 is supported on the Z-stage 4 through the three leaf springs 22a, 22b and 22c.

Also, as shown in FIG. 1, a radial bearing 26 (functioning as a roller) is rotatably supported in the lower portion of the arm portion 21a through a moving shaft having a spherical acting point (pivot) 25 at the upper end thereof. The radial bearing 26 bears against a tapered nut 27 which is threadably engaged with a feed screw 28 rotated by a motor 29 fixed to the Z-stage 4. Thus, the design is such that by the revolution of the motor 29, the nut 28 is axially moved and the position at which the radial bearing 26 bears against the tapered portion of the nut 27 is charged horizontally as viewed in FIG. 1, whereby the pivot 25 is moved in Z-direction. The pivot 25 in the lower portion of the arm portion 21a and the motor 29 will hereinafter be collectively referred to as the "actuator 20a".

Further, this actuator 20a has a potentiometer 30 and the amount of displacement of the pivot 25 in Z-direction is detected by this potentiometer 30 provided on the Z-stage 4. Likewise, actuators 20b and 20c each including a potentiometer of entirely the same construction are incorporated in the lower portions of the other two leaf springs 22b and 22c. By driving the actuators 20a, 20b and 20c thus provided at three locations independently of one another, the levelling stage 3 can be inclined in any direction relative to the imaging plane IM, and further, if the respective pivots 25 are driven by the same amount in Z-direction, the wafer supporting surface on the wafer holder 2 (or the wafer holder holding surface on the levelling stage 3) can be parallel-moved in Z-direction while keeping parallelism to the imaging plane IM.

Figures 3, 3A:
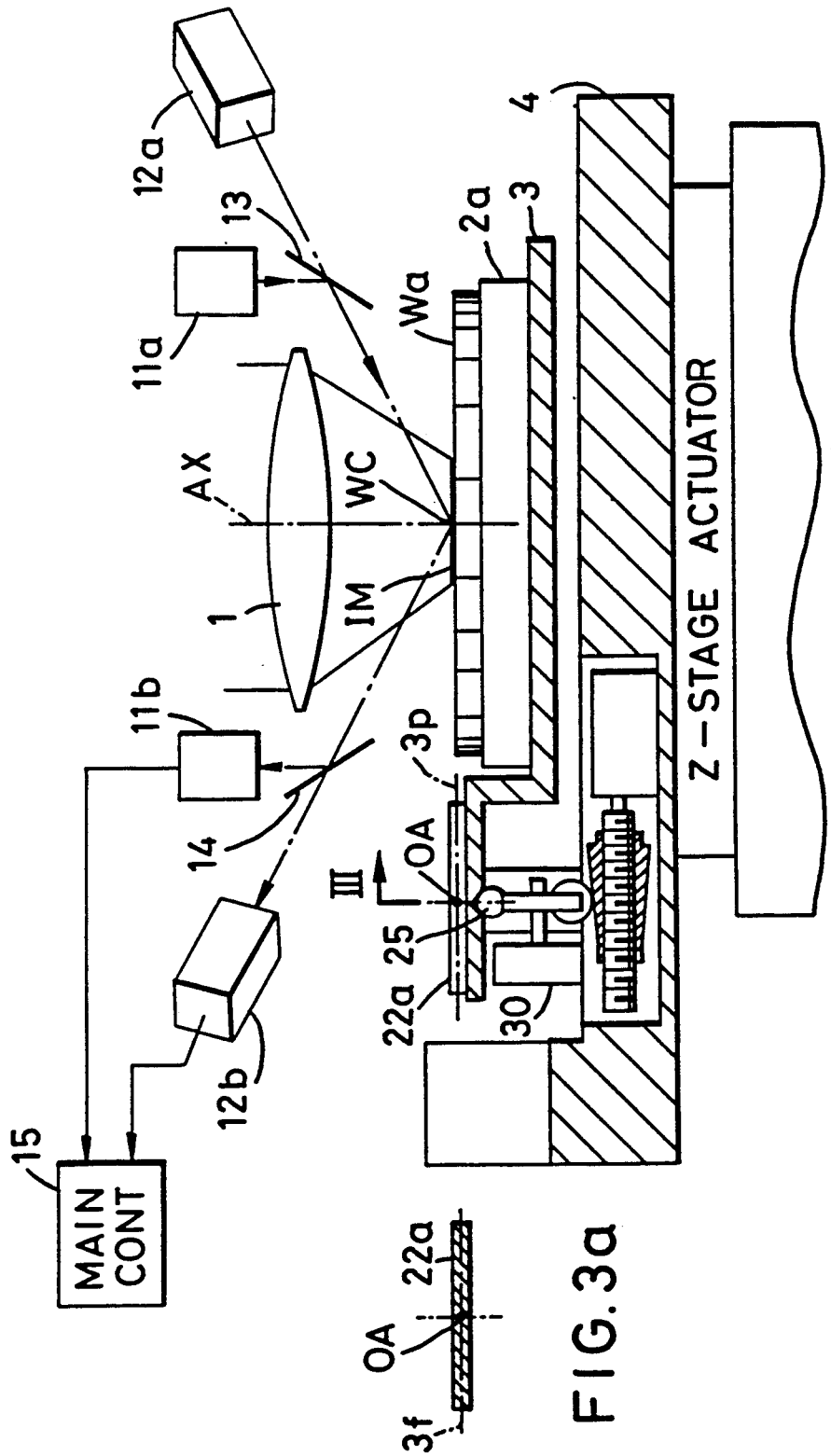
FIG. 3 is a diagram, partly in cross-section, for illustrating the correction of the positional deviation between the levelling reference surface in FIG. 1 and the reference surface of a wafer.
FIG. 3a is a cross-sectional view along the arrow III in FIG. 3 for illustrating the state of the leaf spring in FIG. 3.

During the initial adjustment of the stepper, as shown in FIG. 3, by the use of a reference wafer Wa and a reference wafer holder 2a having very good parallelism between the upper and lower surfaces thereof and having the mean value of the thickness tolerance as the thickness thereof, the levelling reference surface 3P determined by three points, i.e., the deformation reference point OA of the leaf spring 22a and the deformation reference points OB and OC of advance so as to coincide with the imaging plane IM and the surface of the reference wafer Wa.

FIG. 3a is a cross-sectional view of the leaf spring 22a taken along the arrow III in FIG. 3. As shown in FIG. 3a, no tension is applied to the leaf spring 22a (this also holds true of the leaf springs 22b and 22c), and in that state, the detection value of the potentiometer 30 for detecting the amount of displacement of the pivot 25 is reset to zero (or this detection value is memorized as the initial value), and likewise, the detection values of the other two potentiometer are reset to zero (or are memorized as the initial values).

As shown in FIG. 1, there is provided a focus detecting optical system of the oblique incidence type comprising an irradiating optical system 11a having a pin-hole or a slit therein and projecting an imaging light beam for forming the image of the pin-hole or slit toward the imaging plane IM of the projection lens 1 from an oblique direction relative to the optic axis AX through a beam splitter 13, and a light receiving optical system 11b for receiving the reflected light beam of the imaging light beam on the surface of the wafer W through a beam splitter 14. The construction of this focus detecting optical system 11 is disclosed, for example, in U.S. Pat. No. 4,650,983, and this focus detecting optical system detects the vertical (Z-direction) position of the wafer surface relative to the imaging plane IM, and detects the in-focus state of the wafer W and the projection lens 1. In the present embodiment, it is to be understood that along with the position setting operation for the levelling reference surface as the inclination reference plane shown in FIG. 3, the angle of parallel flat glass, not shown, provided in the light receiving optical system 11b is adjusted in advance so that the imaging plane IM becomes the zero point reference, whereby the calibration of the focus detecting optical system 11 is accomplished.

There is further provided a horizontal position detecting optical system 12 comprising an irradiating optical system 12a for projecting a parallel light beam from an oblique direction relative to the optic axis AX through the beam splitter 13, and a light receiving optical system 12b for receiving the reflected light beam of that parallel light beam on the surface of the wafer W through the beam splitter 14. The construction of this horizontal position detecting optical system 12 is disclosed, for example, in the aforementioned U.S. Pat. No. 4,558,949, and this horizontal position detecting optical system 12 detects the inclination of a predetermined area on the wafer W relative to the imaging plane IM. In the present embodiment, the calibration of the horizontal position detecting optical system 12 is effected so that when the surface of the reference wafer Wa and the imaging plane IM become coincident with each other as shown in FIG. 3, the light beam from the irradiating optical system 12a is condensed at the central position of a four-division light receiving element (not shown) in the light receiving optical system 12b.

Also, in FIG. 1, a main controller 15 servocontrols (closed-loop-controls) the actuating portion 5 and the actuators 20a, 20b and 20c on the basis of the detection signals of the focus detecting optical system 11, the horizontal position detecting optical system 12 and the three potentiometers including the potentiometer 30, and further generally controls the operation of the entire apparatus.

A description will now be given of the operation of the apparatus of the embodiment of the present invention constructed as described above. It is to be understood that the main controller 15 memorizes in advance as a reference value ZO the position of the Z-stage 4 when all of the levelling reference surface 3P, the imaging plane IM and the surface of the reference wafer Wa as shown in FIG. 3 are made coincident with one another.

Figure 4:
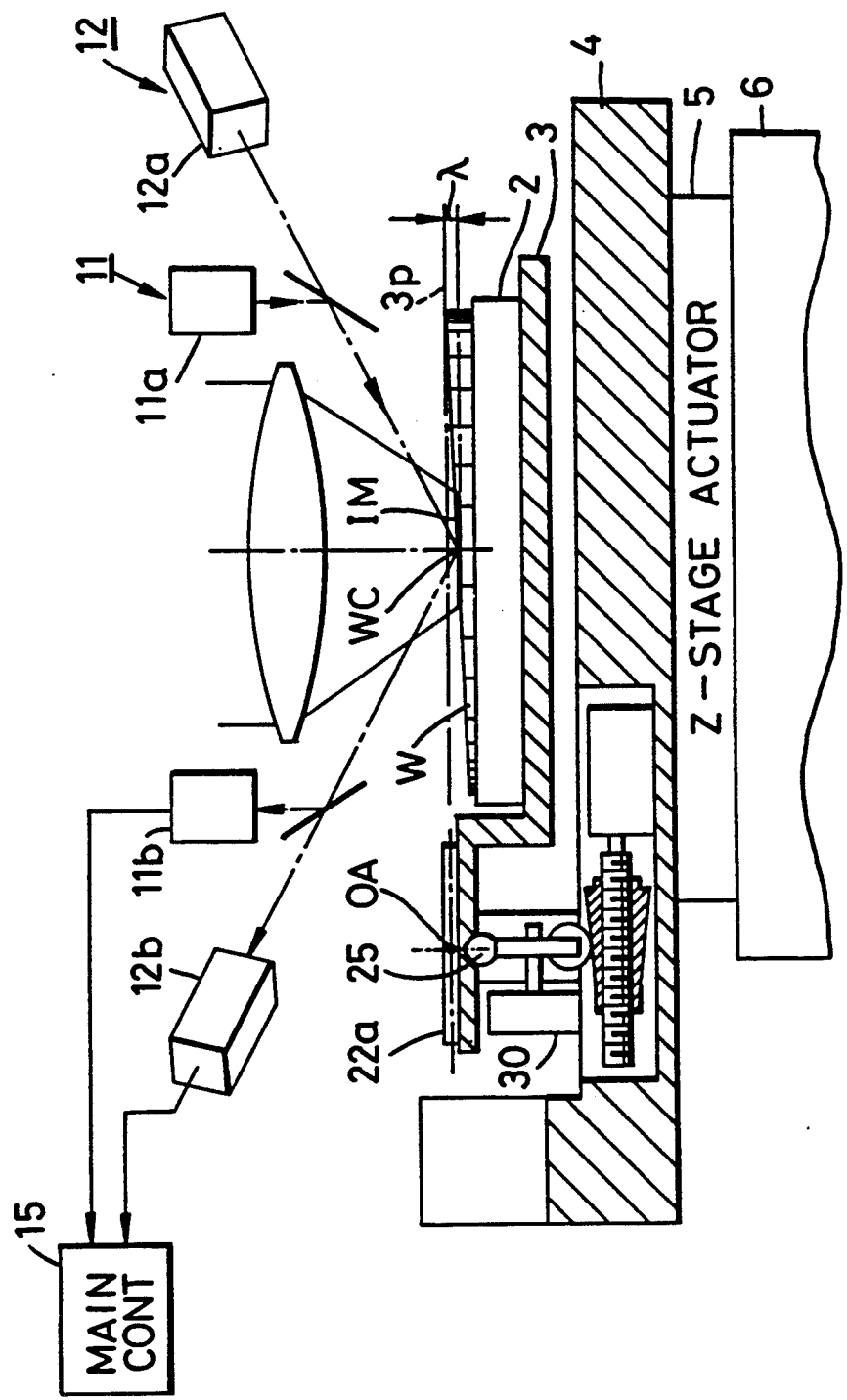
FIG. 4 is a diagram, partly in cross-section, for illustrating the operation of the embodiment shown in FIG. 1, and particularly showing a state in which the surface of the wafer center is brought into coincidence with the imaging plane.

Now, the main controller 15 first makes the wafer W to be exposed be vacuum-absorbed to the wafer holder 2. However, due to variations in the thicknesses of the wafer W and the wafer holder 2, some deviation may occur between the levelling reference surface 3P and the surface of the wafer W, as shown in FIG. 1. So, the main controller 15 uses the focus detecting optical system 11 to drive the Z-stage 4 through the actuating portion 5 so that the detection value of the focus detecting optical system 11 becomes zero, and brings the surface of the wafer center WC into coincidence with the imaging plane IM, as shown in FIG. 4. Further, the main controller 15 detects the then level Zc of the Z-stage 4, and calculates the amount of deviation $\lambda(\lambda = ZO - Zc)$ between the levelling reference surface 3P and the surface of the wafer center WC on the basis of the level Zc and the reference value ZO. When the Z-stage 4 is positioned at a predetermined level (the reference value ZO), the deviation of the surface of the wafer center WC relative to the imaging plane IM may be detected by the use of the focus detecting optical system 11 and the amount of deviation $\lambda$ may be calculated on the basis of the detection value and the reference value ZO.

Figure 5:
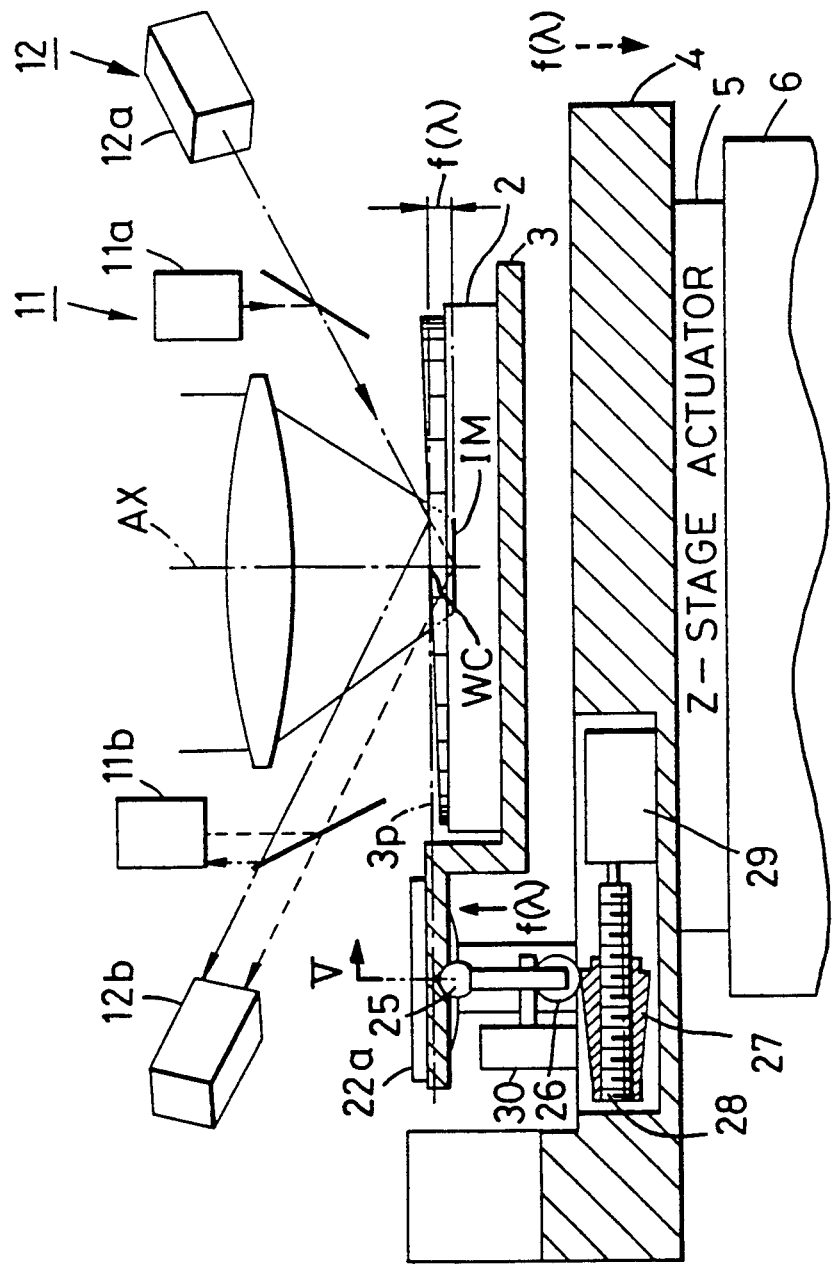
FIG. 5 also is a diagram, partly in cross-section, for illustrating the operation of the embodiment shown in FIG. 1, and particularly showing a state in which the surface of the wafer center is brought into coincidence with the levelling reference surface.
Figure 5A:
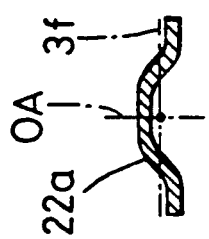
FIG. 5a is a cross-sectional view along the arrow V in FIG. 5 for illustrating the state of the leaf spring in FIG. 5.

Now, as shown in FIG. 4, the wafer center WC is coincident with the imaging plane IM, but deviates from the levelling reference surface 3P by $\lambda$. So, the main controller 15 calculates the amount of movement $f(\lambda)$ of the three pivots including the pivot 25 for bringing the levelling reference surface 3P and the surface of the wafer center WC into coincidence with each other, on the basis of the amount of deviation $\lambda$. The main controller 15 servo-controls the actuators 20a, 20b and 20c on the basis of the detection signal of the amount of displacement of the pivot 25 from the potentiometer 30 so that the three pivots are moved in Z-direction (upwardly) by the same amount $f(\lambda)$. As a result, as shown in FIG. 5, the levelling reference surface 3P and the surface of the wafer center WC exactly coincide with each other. FIG. 5a is a cross-sectional view taken along the arrow V in FIG. 5 and showing the then deformed state of the leaf spring 22a.

As shown in FIG. 5a, with the movement of the pivot 25, the leaf spring 22a is bent and the deformation reference point OA thereof moves in Z-direction by a predetermined amount $f(\lambda)$. At that time, the deformation reference point OA and the other two deformation reference points OB and OC and the surface of the wafer center WC are moved in Z-direction (upwardly) relative to one another to thereby bring the levelling reference surface 3P and the surface of the wafer center WC into coincidence with each other. Therefore, the deviation between the surface of the wafer center WC and the imaging plane IM, i.e., focus deviation, occurs as shown in FIG. 5. So, the main controller 15 servo-controls the actuating portion 5 for the Z-stage 4 on the basis of the amount of deviation $f(\lambda)$ of the wafer center WC relative to the imaging plane IM. That is, the main controller servo-controls the actuating portion 5 by the use of the focus detecting optical system 11 so that the surface of the wafer center WC coincides with the imaging plane IM, and moves the Z-stage 4 in Z-direction (downwardly) by $f(\lambda)$. Thus, the levelling reference surface 3P, the imaging plane IM and the surface of the wafer center WC have all become coincident with one another.

Subsequently, the main controller 15 drives the X-Y stage 6 and sets the wafer W at a predetermined exposure starting position, whereafter it detects the angle of inclination of the shot area relative to the imaging plane IM by the use of the horizontal position detecting optical system 12. Then, the amounts of movement of the three pivots 25 with the wafer center WC as the apparent center of rotation of the levelling stage 3 are calculated from the angle of inclination of the aforementioned shot area so that the inclination of the shot area becomes zero without the surface of the wafer center WC and the levelling reference surface 3P deviating from each other.

Subsequently, by the use of the three potentiometers 30 and the horizontal position detecting optical system 12, the main controller servo-controls the actuators 20a, 20b and 20c on the basis of the amounts of movement of the above-described three pivots 25 and also servo-controls the actuating portion 5 by the use of the focus detecting optical system 11 so that no focus deviation may occur. Thereby, the shot area and the imaging plane IM become exactly coincident with each other and exposure is effected without focus deviation or the like occurring. Thereafter, by repetitively effecting the above-described operation for each shot area on the wafer W, the amount of lateral deviation comprising the sum of cosine error and sine error can be suppressed to less than a predetermined tolerance value (the resolving power of the laser interferometer) and exposure can be accomplished without reducing the throughput, etc.

Figure 6:
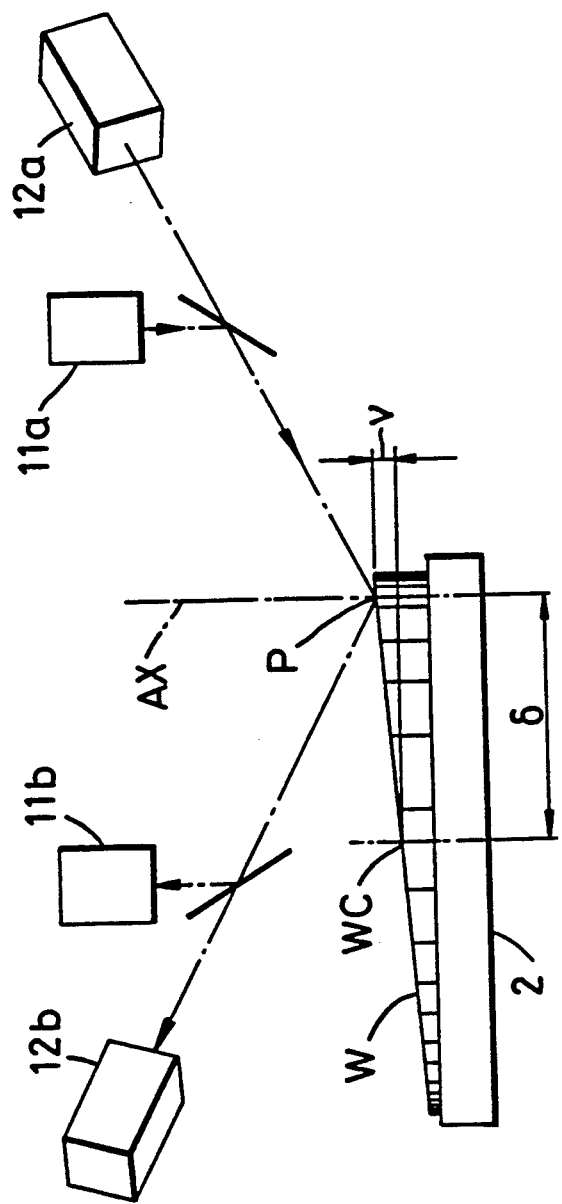
FIG. 6 is a schematic illustration for illustrating cosine error and sine error.

In the present embodiment, the surface of the wafer center WC and the levelling reference surface 3P are brought into coincidence with each other and levelling is effected with the wafer center WC as the apparent center of rotation of the levelling stage 3 and therefore, the cosine error $\Delta Ce$ occurring with levelling can be minimized on the whole surface of the / wafer W. For example, the distance $\delta$ between the center of rotation of the levelling stage 3, i.e., the wafer center WC, and the central point P of the shot area located near the outer periphery of the wafer W as shown in FIG. 6 is of the order of 100 mm at greatest (in the case of an 8-inch wafer), but even in the worst case, the cosine error $\Delta Ce$ can be suppressed to the order of $\Delta Ce = 0.004 \mu m$.

Also, as regards the sine error, the amount of deviation $\lambda$ between the levels of the levelling reference surface 3P and the wafer center WC is zero and therefore, the factors for the variations in the thicknesses of the wafer W and the wafer holder 2 can be eliminated. Therefore, if there is not the thickness irregularity t due to TTV, the sine error will become zero, but as shown in FIG. 6, there may occur a sine error $\Delta Se$ with only the thickness irregularity t, i.e., the amount of deviation $\nu$ between the levels of the wafer center C and the central point P of the shot area as a factor. However, since TTV is of the order of $t = 20 \mu m$ as previously described, the sine error $\Delta Se$ can be suppressed to the order of $\Delta Se = 0.006 \mu m$ for the angle of inclination $\theta = 1'$ of the wafer even in the worst case. Accordingly, even if the above-mentioned two errors are added together, the amount of lateral deviation occurring with levelling is of the order of 0.01 μm, and the positioning accuracy of the wafer stage can be satisfied sufficiently.

Thus, when any deviation occurs between the levelling reference surface 3P and the surface of the wafer W, an operation similar to what has been described above is suitably repeated to thereby bring the levelling reference surface 3P and the surface of the wafer center WC into coincidence with each other, whereafter levelling is effected, whereby it becomes possible to accomplish exposure without reducing the positioning accuracy of the wafer stage, the throughput, etc.

As described above, in the present embodiment, the cosine error ΔCe can be suppressed to the order of 0.004 μm, but cannot always be made zero. However, as described above, levelling is effected without any deviation occurring between the levelling reference surface 3P and the surface of the wafer center WC and therefore, the wafer center WC can be specified as the center of rotation of the levelling stage 3. So, if the cosine error ΔCe is calculated from the distance δ between the wafer center WC and the central point P of any shot area on the wafer W and after levelling, the X-Y stage 6 is finely moved in conformity with this amount of lateral deviation, the cosine error ΔCe can be made zero.

Also, in the present embodiment, levelling has been effected with the surface of the wafer center WC and the levelling reference surface 3P always kept coincident with each other, but the levels (the positions in Z-direction) at the center WC of the wafer W and a plurality of positions around it may be detected in advance by the use of the focus detecting optical system 11 and weighting may be effected on these detection values to thereby find the imaginary reference surface of the wafer W. It is apparent that if levelling is effected by an operation similar to that described above with the center of said imaginary reference surface as the center of rotation of the levelling stage 3 while said imaginary reference surface and the levelling reference surface 3P are always kept coincident with each other at the center of the imaginary reference surface, the amounts of movement of the three pivots 25 can be made small and it becomes possible to shorten the time required for levelling.

Further in the present embodiment, levelling has been effected for each shot area with the levelling reference surface 3P and the surface of the wafer center WC made coincident with each other in advance, but the levelling method by the apparatus of the present invention is not restricted to the above-described embodiment. A similar effect can also be obtained, for example, by so-called global levelling in which before exposure is effected, the angles of inclination of the shot areas at a plurality of locations on the wafer W are detected in advance by the use of the horizontal position detecting optical system 12 and the average angle of inclination on the whole surface of the wafer W is found from these angles of inclination and with the wafer center WC as the center of rotation, the levelling stage 3 is once inclined before exposure on the basis of the average angle of inclination. Alternatively, an effect similar to that of the above-described embodiment can also be obtained when effecting so-called block levelling in which the shot area on the wafer W is divided into several blocks and on the basis of the average angle of inclination found for each block, the levelling stage 3 is once inclined for each block with the central point of each block as the center of rotation.

Also, if instead of levelling being effected for each shot area after the levelling reference surface 3P and the surface of the wafer center WC are brought into coincidence with each other, the central point P of each shot area and the levelling reference surface 3P are brought into coincidence with each other by an operation similar to that of the present embodiment and thereafter levelling is effected without any deviation occurring between the central point P of the shot areas and the levelling reference surface 3P, the sine error ΔSe due to TTV can be made zero. At this time, the central point P of the shot areas becomes the center of rotation of the levelling stage 3 and therefore, the cosine error ACe also becomes zero. Accordingly, it becomes possible to effect exposure with the projected image of the circuit pattern of the reticle and the circuit pattern already formed on the wafer W being superposed one upon the other with higher accuracy.

The amounts of movement of the pivots 25 for making the levelling reference surface 3P and the central point P of the shot areas coincident with each other for each shot area and the amounts of movement of the pivots 25 for making the surface of the shot areas and the imaging plane IM coincident with each other (levelling) are found together in a software fashion by the use of the focus detecting optical system 11 and the horizontal position detecting optical system 12. It is apparent that if the design is made such that the three pivots 25 are once drivingly controlled in conformity with the amounts of movement to thereby effect levelling, superposition exposure can be accomplished with higher accuracy without reducing the throughput.

While the present embodiment has been described with respect to a projection type exposure apparatus (stepper), a similar effect can also be obtained in a proximity type exposure apparatus or the like. Also, in the present embodiment, levelling has been effected in the three-point drive system, but the levelling system according to the present invention is not restricted thereto. However, when viewed from the viewpoints of levelling and control time, the three-point drive system is more desirable.

We claim:

1. An exposure apparatus for forming a pattern of a mask on a surface of a photo-sensitive substrate, comprising:

an X-Y stage movable along orthogonal X and Y axes parallel to an exposure reference plane;

a Z-stage on said X-Y stage and movable relative thereto along a Z-axis orthogonal to said X and Y axes;

a levelling stage on said Z-stage and inclinable relative to a levelling reference plane that is parallel to said exposure reference plane, said levelling stage having means for holding said photosensitive substrate thereon;

levelling means for moving predetermined points of said levelling stage along said Z-axis;

first detecting means for detecting deviation of a reference point of said photo-sensitive substrate from said exposure reference plane along said Z-axis;

second detecting means for detecting inclination of said surface of said photo-sensitive substrate relative to said levelling reference plane; and control means responsive to said first detecting means for moving said Z-stage in one direction along said Z-axis relative to said X-Y stage to make said reference point of said photo-sensitive substrate coincident with said exposure reference plane, for controlling said levelling means to move all of said predetermined points of said levelling stage by the same amount in said one direction along said Z-axis to make said reference point of said photo-sensitive substrate coincident with said levelling reference plane, while moving said reference point of said photosensitive substrate relative to said exposure reference plane, and for moving said Z-stage in the opposite direction along said Z-axis to make said reference point of said photo-sensitive substrate and said levelling reference plane coincident with said exposure reference plane, said control means being responsive to said second detecting means to control said levelling means so as to provide relative movement between at least some of said predetermined points of said levelling stage to change the inclination of said surface of said photo-sensitive substrate so as to make said surface substantially coincident with said exposure reference plane.

2. An exposure apparatus according to claim 1, wherein said first detecting means includes a focus detecting optical system for detecting the amount of deviation of the surface of said photosensitive substrate relative to said exposure reference plane, and outputs a detection signal conforming to the spacing between said exposure reference plane and the surface of said photosensitive substrate.

3. An exposure apparatus according to claim 1, wherein said levelling means includes a plurality of spring members coupling said levelling stage to said Z-stage and resiliently deformable along said Z-axis in response to operation of said levelling means, said plurality of spring members having deformation reference points corresponding, respectively, to said predetermined points of said levelling stage.

4. An exposure apparatus according to claim 3, wherein said control means includes driving means for displacing the deformation reference points of said plurality of spring members to thereby effect position setting of the surface of said photosensitive substrate relative to said levelling reference plane.

5. An exposure apparatus according to claim 4, wherein said control means further includes means for detecting the amount of displacement of said deformation reference points, and means for servo-controlling said driving means in response to said means for detecting the amount of displacement and said first detecting means.

6. An exposure apparatus according to claim 3, wherein said levelling stage has a plurality of arm portions extending radially outwardly and holding said spring members, and said levelling means includes pivots for supporting respective ones of said arm portions, and a drive motor provided on said Z-stage for driving said arm portions through said pivots along said Z-axis substantially perpendicular to said exposure reference.

7. An exposure apparatus according to claim 6, wherein said control means further includes a potentiometer for detecting the amount of movement of said pivots along said Z-axis, and controls said drive motor on the basis of a detection signal of said potentiometer.

8. An apparatus for bringing a surface of a substrate into coincidence with a reference plane, comprising:

an X-Y stage movable along orthogonal X and Y axes parallel to said reference plane;
a Z-stage on said X-Y stage and movable relative thereto along a Z-axis orthogonal to said X and Y axes;
levelling means including a levelling stage on said Z-stage, said levelling stage being movable relative to said Z-stage along said Z-axis, being inclinable relative to a levelling reference surface that is parallel to said reference plane, and having means for holding said substrate thereon;
means for detecting positional deviation of said surface of said substrate from said reference plane along said Z-axis; and
control means for controlling said Z-stage and said levelling means on the basis of positional deviation detected by said detecting means so as to move said Z-stage together with said levelling stage until a reference point of said substrate is coincident with said reference plane, then to move said levelling stage relative to said Z-stage until said reference point of said substrate is coincident with said levelling reference surface, and then to move said Z-stage together with said levelling stage until both said reference point of said substrate and said levelling reference surface are coincident with said reference plane.

9. In an exposure apparatus comprising an X-Y stage movable along orthogonal X and Y axes parallel to a reference plane, a Z-stage on said X-Y stage and movable relative thereto along a Z-axis orthogonal to said X and Y axes, a levelling stage on said Z-stage and inclinable relative to a levelling reference surface that is parallel to said reference plane, said levelling stage having means for holding a substrate thereon, inclination detecting means for detecting inclination of a surface of said substrate relative to said reference plane, and deviation detecting means for detecting positional deviation of said surface of said substrate from said reference plane along said Z-axis, a method of bringing the surface of said substrate into coincidence with said reference plane, comprising the following steps in the order named;

moving said Z-stage in response to said deviation detecting means until a reference point of said substrate is coincident with said reference plane;
moving said levelling stage along said Z-axis relative to said Z-stage in response to said deviation detecting means until said reference point of said substrate is coincident with said levelling reference surface;
moving said Z-stage in response to said deviation detecting means until both said reference point of said substrate and said levelling reference surface are coincident with said reference plane; and
moving said levelling stage in response to said inclination detecting means until said surface of sadi substrate is coincident with said reference plane.

10. A method according to claim 9, wherein the moving of said levelling stage in response to said deviation detecting means comprises moving a plurality of points of said levelling stage by the same amount along said Z-axis.

11. A method according to claim 10, wherein said moving of said levelling stage in response to said inclination detecting means comprises moving some of said plurality of points relative to others of said plurality of points along said Z-axis.

* * * * *